(12) United States Patent
Osawa et al.

(10) Patent No.: US 6,700,184 B1
(45) Date of Patent: Mar. 2, 2004

(54) LEAD FRAME AND SEMICONDUCTOR DEVICE HAVING THE SAME

(75) Inventors: Kenji Osawa, Kanagawa (JP); Haruhiko Makino, Kanagawa (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 09/009,248

(22) Filed: Jan. 20, 1998

(30) Foreign Application Priority Data

Jan. 20, 1997 (JP) .......................................... P09-007953

(51) Int. Cl.$^7$ ........................ H01L 23/495; H01L 23/02
(52) U.S. Cl. ........................ 257/667; 257/668; 257/676; 257/680; 257/670; 257/673
(58) Field of Search ................................. 257/667, 668, 257/676, 680, 670, 673

(56) References Cited

U.S. PATENT DOCUMENTS

| | | | | |
|---|---|---|---|---|
| 5,136,366 A | * | 8/1992 | Worp et al. ................... | 257/687 |
| 5,198,883 A | * | 3/1993 | Takahashi et al. | |
| 5,255,157 A | * | 10/1993 | Hegel .......................... | 361/783 |
| 5,336,931 A | * | 8/1994 | Juskey et al. ................ | 257/787 |
| 5,355,283 A | * | 10/1994 | Marrs et al. ................. | 361/760 |
| 5,367,191 A | * | 11/1994 | Ebihara ....................... | 257/666 |
| 5,554,885 A | * | 9/1996 | Yamasaki et al. ............ | 257/666 |
| 5,557,150 A | * | 9/1996 | Variot et al. ................. | 257/787 |
| 5,683,942 A | * | 11/1997 | Kata et al. ................... | 438/118 |
| 5,756,377 A | * | 5/1998 | Ohsawa | |
| 5,773,895 A | * | 6/1998 | Hassan et al. ............... | 257/774 |
| 5,847,446 A | * | 12/1998 | Park et al. | |
| 6,240,632 B1 | * | 6/2001 | Ito et al. ....................... | 29/827 |

FOREIGN PATENT DOCUMENTS

JP 4162734 * 6/1992

* cited by examiner

*Primary Examiner*—David E. Graybill
(74) *Attorney, Agent, or Firm*—Sonnenschein, Nath & Rosenthal LLP (57) ABSTRACT

There is provided a semiconductor device and a lead frame that form a stable external ring structure wherein bonding strength and mechanical strength between the external ring and sealing resin is improved. A semiconductor device (1) is formed which comprises a semiconductor chip (2) having a plurality of electrode pads (3) formed at the periphery of a front surface thereof, a wiring film (5) located and formed on the front surface side of the semiconductor chip (2) by laminating an insulation film (7) on a lead pattern (6), outer connection terminals (8) formed so as to protrude above the wiring film (5), a plurality of leads (9) extending form the wiring film (5) and connected to the electrode pads (3) on the semiconductor chip (2) at extended tip ends thereof, an external ring (11) provided so as to surround the semiconductor chip (2) and formed with a plurality of through holes or blind holes (15), and a sealing resin (12) filled between the semiconductor chip (2) and the external ring (11).

9 Claims, 12 Drawing Sheets

LEAD FRAME AND SEMICONDUCTOR DEVICE HAVING THE SAME

BACKGROUND OF THE INVENTION

The present invention relates to a novel lead frame and a semiconductor device in which a semiconductor chip is bonded to the lead frame and, more particularly, to a structure of an external ring for enhancing the strength of sealing resin for the same.

Figure 1:
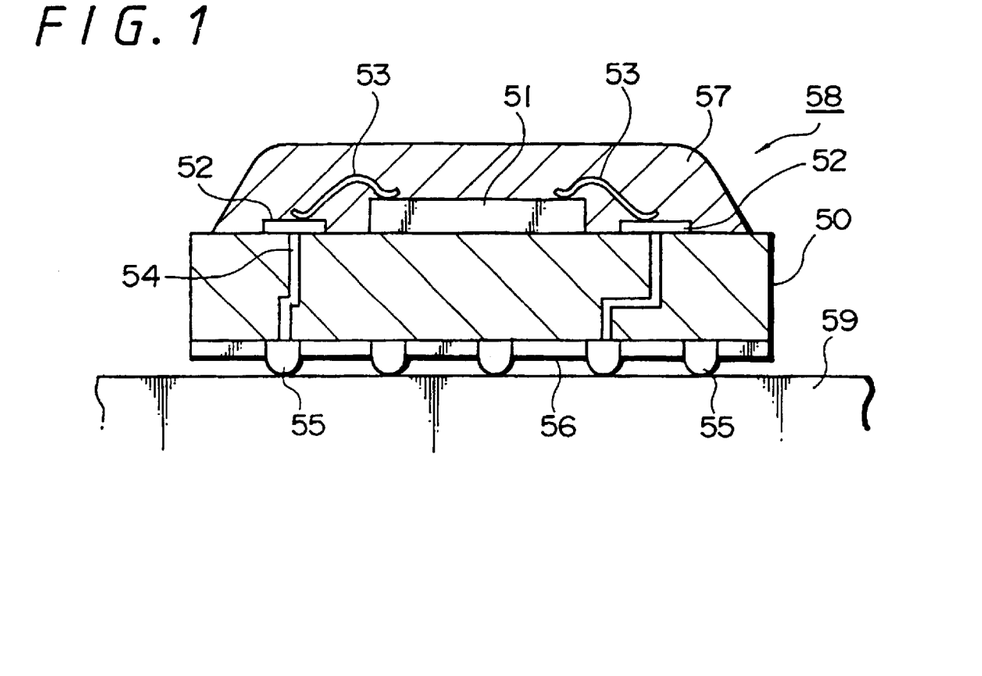
FIG. 1 is a schematic configuration view (sectional view) showing an example of a BGA package.

There is a semiconductor package as shown in FIG. 1 which can be mounted on a printed wiring board or the like through an organic substrate having external connection terminals such as solder balls or the like.

Referring to FIG. 1, a semiconductor chip 51 is mounted on a surface of a multilayer organic wiring board 50 having two to six layers or so made of an organic material. The electrode pads of the semiconductor chip 51 and a wiring film 52 formed on a surface of the multilayer organic wiring board 50 are connected to each other by means of wire bonding utilizing gold wires 53.

On the rear surface of the multilayer organic wiring board 50, there are provided solder balls (external connection terminals) 55 which are electrically connected to the wiring film 52 on the front surface via through holes 54. The solder balls 55 are exposed to the outside through openings formed through a solder resist film 56. The semiconductor chip 51 together with the gold wires 53 is sealed by a sealing resin 57.

In a semiconductor package 58 having the above-described configuration, the solder balls 55 formed on the rear surface are connected to a printed wiring board 59. The multilayer organic wiring board 50 is frequently referred to as "ball grid array (BGA)" because a multiplicity of solder balls 55 are arranged in the form of a grid. Therefore, the semiconductor package 58 having such a multilayer organic circuit board 50 is referred to as a "BGA package".

In the semiconductor package 58 as described above, reduction of a wiring pitch has been limited by the fact that the electrode pads of the semiconductor chip 51 and the wiring film 52 of the multilayer organic wiring board 50 have been connected by means of wire bonding. Efforts toward an increased number of pins have been also limited in other semiconductor packages such as TCPs (tape carrier packages) because the leads have been formed by etching a copper foil bonded to an insulating film base and this has resulted in limitations such as a reduction in the width of the leads due to side etching.

Under such circumstances, the assignee of the present invention has already proposed a semiconductor package having a super-many pin structure obtained by bonding a novel lead frame and a semiconductor chip.

Figure 2:
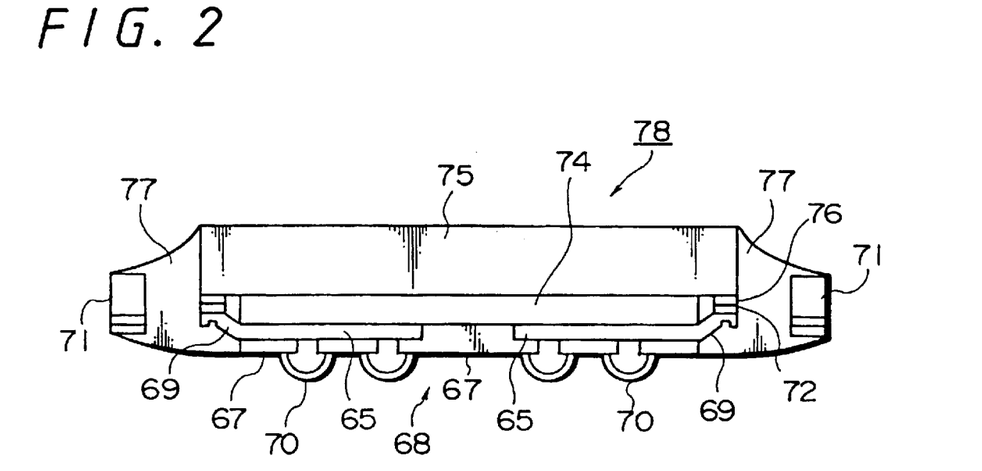
FIG. 2 is a schematic configuration view (sectional view) showing an example of a semiconductor package having a super-many pin structure.

FIG. 2 shows an example of the semiconductor package having the super-many pin structure.

In this semiconductor package 78, a plurality of electrode pads 76 are formed along the periphery of a front surface of a semiconductor chip 75 (a lower surface of the semiconductor chip 75 in FIG. 2). At the central portion of the surface of the semiconductor chip 75 excluding the region where the electrode pads 76 are formed, there is located a wiring film 68 with an adhesive layer 74 constituted by an adhesive sheet or the like interposed therebetween. The wiring film 68 is configured by laminating an insulation film 67 on a lead pattern 65. The adhesive layer 74 not only bonds the semiconductor chip 75 and the wiring film 68 but also serves as a buffering material for protecting an element formation region of the semiconductor chip 75 inside the region where the pads are formed.

External connection terminals 70 constituted by solder balls are formed so as to protrude above the wiring film 68 at ends of the lead patterns 65. A plurality of leads 69 are extend from the wiring film 68 in correspondence with the lead pattern 65, and the extended ends of the leads 69 are connected to the electrode pads 76 of the semiconductor chip 75 through bumps 72. An external ring 71 is provided outside the semiconductor chip 75 so as to surround the same. Sealing resin 77 is filled in the gap between the semiconductor chip 75 and the external ring 71.

A lead frame is formed by the external connection terminals 70, the insulation film 67, the lead patterns 65 for the circuit wiring, leads the 69 and the external ring 71.

Due to the above-described structure, the semiconductor chip 75 and the lead patterns 65 are bonded to each other with high accuracy, and the external size of the semiconductor package 78 is made as close to the size of the semiconductor chip 75 as possible by forming the balls 70 for the external terminals on the upper surface of the semiconductor chip 75.

A brief description will now be made on processes for fabricating the semiconductor package 78.

Figure 3A:
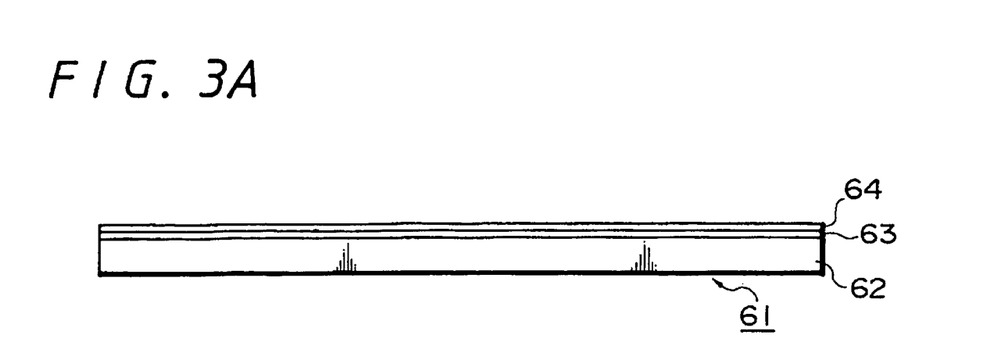
FIGS. 3A through 3L are process diagrams for fabricating the semiconductor package shown in FIG. 2.

First, as shown in FIG. 3A, a metal base 61 having a three-layer structure is prepared for the fabrication of the lead frame. The metal base 61 is obtained by forming an aluminum film 63 on a surface of a substrate 62 made of copper or a copper alloy (hereinafter referred to "copper substrate") and forming a nickel film 64 on the aluminum film 63.

Figure 3B:
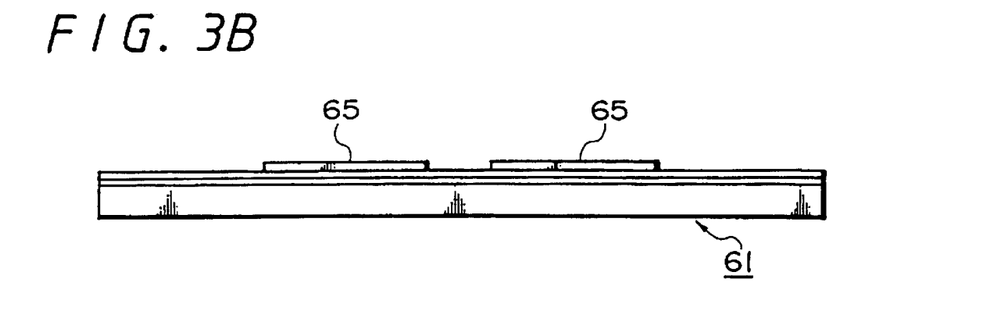

Next, as shown in FIG. 3B, a plurality of lead patters 65 are formed on a surface of the metal base 61 by means of electrolytic plating of copper.

Figure 3C:
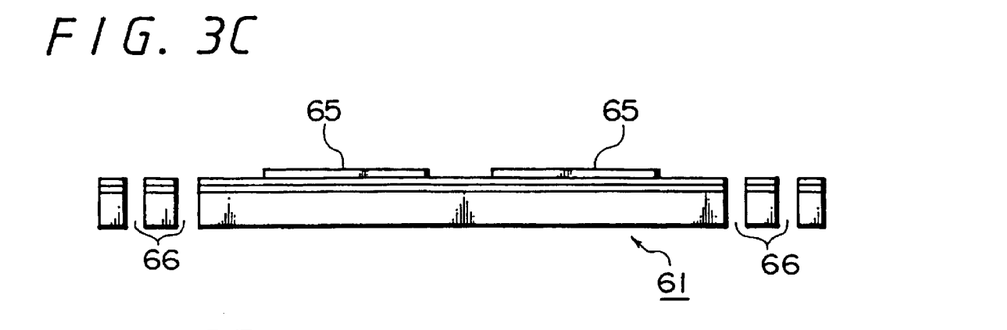

Then, as shown in FIG. 3C, slits 66 are formed to define an external configuration of the lead frame for each chip.

Figure 3D:
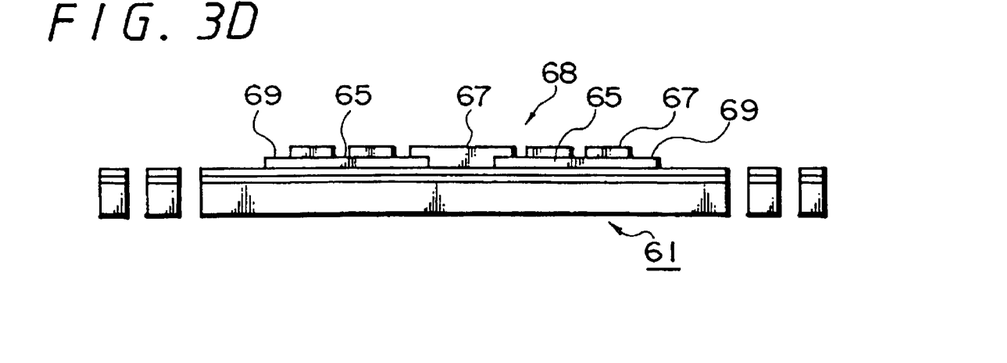

Next, as shown in FIG. 3D, the insulation film 67 is laminated on the lead patterns 65 to form the wiring film 68 constituted by the lead patterns 65 and the insulation film 67. The plurality of leads 69 extend from the wiring film 68 in correspondence with the lead patterns 65.

Figure 3E:
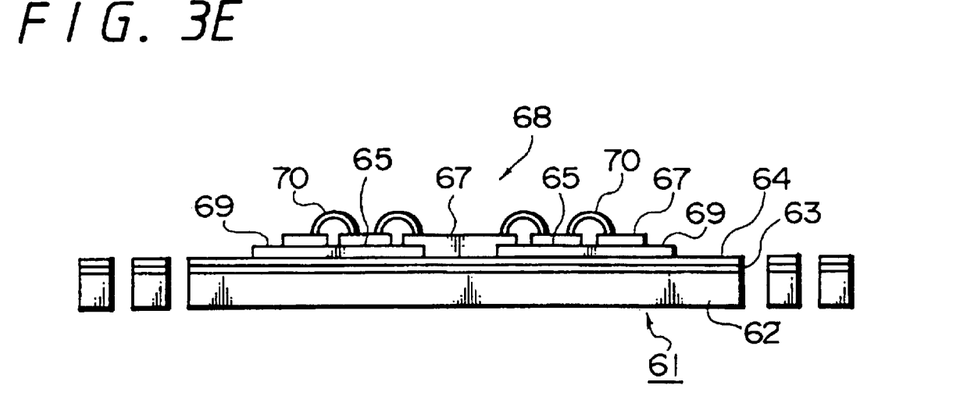

Next, as shown in FIG. 3E, electrolytic plating is performed to form the external connection terminals (solder balls) 70 on the lead patterns 65 coated with the insulation film 67.

Figure 3F:
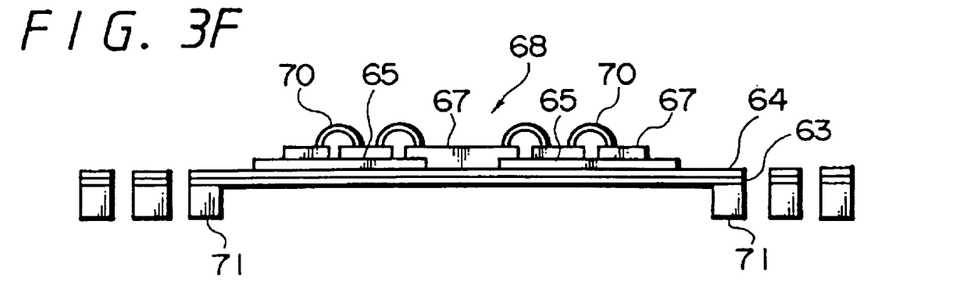
Figure 3G:
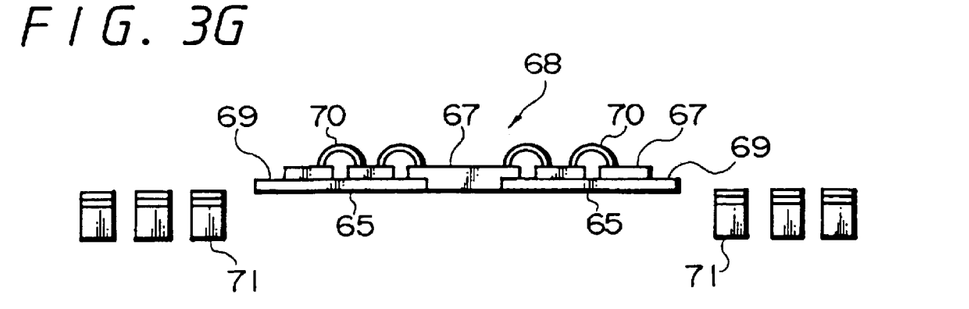

Next, as shown in FIGS. 3F and 3G, the copper substrate 62, the aluminum film 63 and the nickel film 64 on the metal base 61 are successively removed by means of selective etching so as to leave the external ring 71, thereby separating the lead patterns 65 (including the leads 69) individually from one another.

Figure 3H:
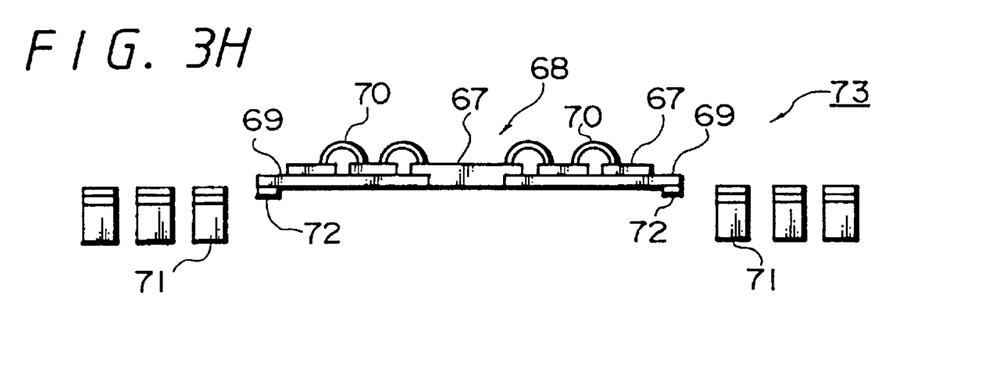

Next, as shown in FIG. 3H, the bump 72 is formed on the end of each of the leads 69 extending from the wiring films 67.

Up to this process, a lead frame 73 before assembling the semiconductor chip is completed.

Then, the process proceeds to the fabrication of a semiconductor package wherein the semiconductor chip 75 is assembled into the lead frame 73.

Figure 3I:
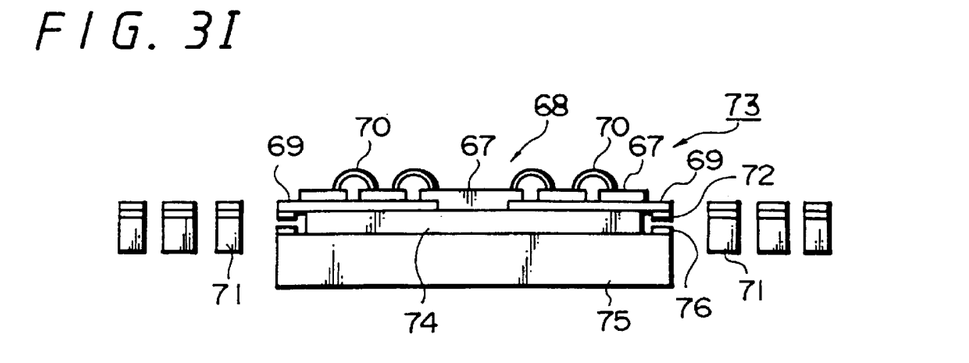

First, as shown in FIG. 3I, the semiconductor chip 75 is positioned and fixed on the rear surface side of the wiring film 68 with the adhesive layer 74 interposed therebetween.

Figure 3J:
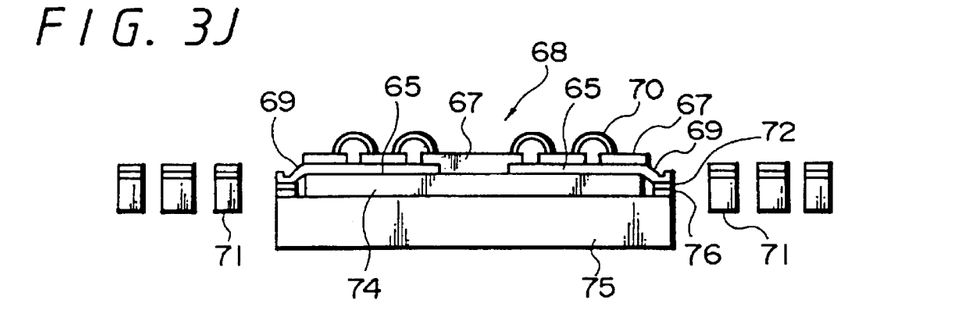

Next, as shown in FIG. 3J, the tip end of each lead 69 is connected to the electrode pad 76 of the semiconductor chip 75 through the bump 72.

Figure 3K:
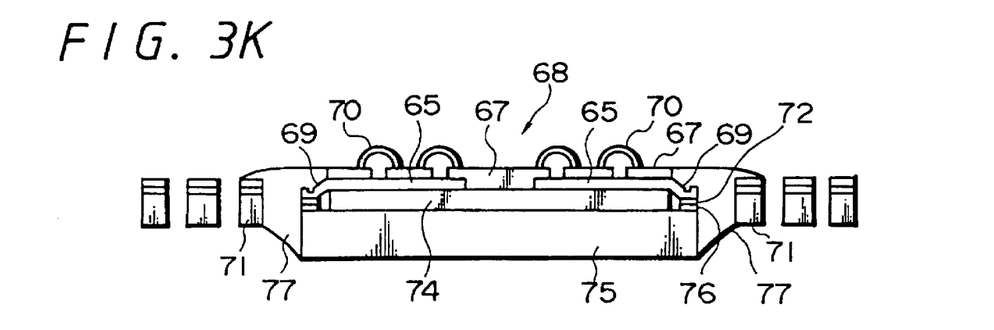

Next, as shown in FIG. 3K, the liquid sealing resin 77 is injected into the gap between the semiconductor chip 75 and the external ring 71 using a dispenser or the like and is set to integrate peripheral components.

Figure 3L:
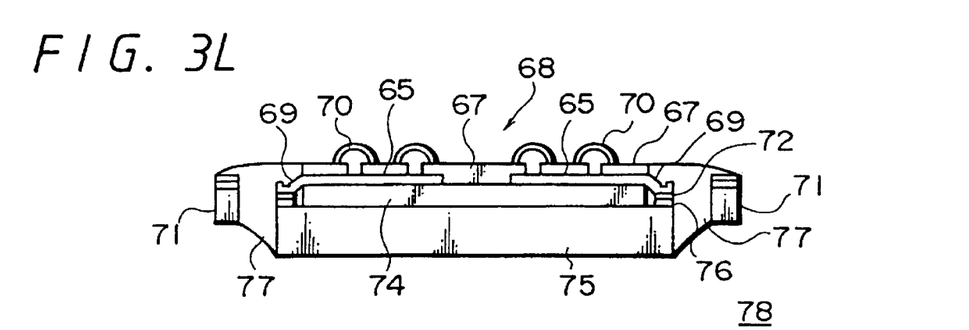

Finally, as shown in FIG. 3L, any unnecessary part is cut off at the peripheral edge of the external ring 71.

This completes the semiconductor package 78 having a super-many pin structure shown in FIG. 2.

In the semiconductor package 78, a structure having super-many pins in the excess of that achievable up to now is realized by forming the lead patterns 65 on the metal base 61 by means of electrolytic plating of copper during the fabrication of the lead frame 73 and further by forming the external connection terminals (solder balls) 70 on the lead patterns 65 by means of electrolytic plating.

Further, the metal base 61 is subjected to selective etching to leave the external ring 71 which defines the external configuration of the package. As a result, the positional accuracy between the external configuration of the package and the external connection terminals 70 is assured to facilitate alignment during the mounting of the package. In addition, a so-called CSP (chip size package) structure is achieved wherein the size of the package is maintained at the same level as the chip size.

When the semiconductor package 78 is fabricated, the sealing resin 77 is filled in the gap between the semiconductor chip 75 and the external ring 71 by injecting the resin from the rear side of the semiconductor chip 75. This is because problems as described below arise if the resin is injected from the front side of the semiconductor chip 75.

(1) It is difficult to fill the gap between the semiconductor chip 75 and the external ring 71 with the sealing resin 77 by injecting the resin from the front side of the semiconductor chip 75 because the gap is narrow (on the order of 0.1 mm).

(2) The sealing resin 77 will stick even to the external connection terminals (solder balls) 70 if there is any error in the relative position of the semiconductor package 78 and the dispenser.

(3) The operation of injecting resin is difficult to perform because of the presence of the leads 69.

On the contrary, injection of the resin from the rear side of the semiconductor chip 75 allows the sealing resin 77 to be smoothly filled in the gap between the semiconductor chip 75 and external ring 71 because this resin injecting operation is not hindered by components such as the leads 69, the external connection terminals 70 or the like and a sufficient amount of sealing resin 77 will be supplied utilizing a step formed between the rear side of the semiconductor chip 75 and the external ring 71.

While the strength of the semiconductor package 78 having the above-described structure in the region between the semiconductor chip 75 and the external ring 71 has been maintained by injecting a sufficient amount of sealing resin 77 to the gap between the semiconductor chip 75 and external ring 71, in this case, sealing strength has been insufficient because it has depended only upon surface bonding strength between the external ring 71 and sealing resin 77.

SUMMARY OF THE INVENTION

In order to solve the above-described problem, according to the present invention, there are provided a semiconductor device and a lead frame which form a stable external ring structure wherein not only bonding strength between the external ring and the sealing resin but also mechanical strength is improved.

A semiconductor device according to the present invention comprises a semiconductor chip having a plurality of electrode pads formed at the periphery of a front surface thereof, a wiring film formed on the front surface side of the semiconductor chip by laminating an insulation film on lead patterns, external connection terminals formed so as to protrude above the same, a plurality of leads extending from the wiring film and connected to the electrode pads on the semiconductor chip at the tip ends of the extensions thereof, an external ring provided so as to surround the semiconductor chip and formed with a plurality of through holes or blind holes, and sealing resin filled in the gap between the semiconductor chip and the external ring.

With the configuration of the semiconductor device according to the invention as described above, since the external ring formed with the plurality of through holes or blind holes is provided to surround the semiconductor chip and the sealing resin is filled in the gap between the semiconductor chip and the external ring, bonding strength is enhanced as a result of an increase in the area of contact between the sealing resin and the external ring due to the presence of the holes on the external ring.

A lead frame according to the present invention comprises a wiring film formed by laminating an insulation film on lead patterns, external connection terminals formed so as to protrude above the wiring film, a plurality of leads extending from the wiring film and forming connecting portions to electrode pads on a semiconductor chip at the tip ends of the extensions thereof, and an external ring provided outside the wiring film, having an opening capable of housing the semiconductor chip and formed with a plurality of through holes or blind holes.

With the configuration of the lead frame according to the invention as described above, since there is provided the external ring having the opening capable of housing the semiconductor chip and formed with the plurality of through holes or blind holes, the external ring will contact with resin in an increased area during injection of the resin performed later for sealing as a result of an increase in the surface area of the external ring due to the presence of the holes thereon.

DETAILED DESCRIPTION OF PREFERRED EMBODIMENTS

According to the present invention, there is provided a semiconductor device comprising a semiconductor chip having a plurality of electrode pads formed at the periphery of a front surface thereof, a wiring film located and formed on the front surface side of the semiconductor chip by laminating an insulation film on lead patterns, external connection terminals formed so as to protrude above the wiring film, a plurality of leads extending from the wiring film and connected to electrode pads on the semiconductor chip at the tip ends of the extensions thereof, an external ring provided so as to surround the semiconductor chip and formed with a plurality of through holes or blind holes, and sealing resin filled in the gap between the semiconductor chip and the external ring.

Further, according to the present invention, the semiconductor device has a configuration wherein an outwardly expanded open portion is formed on an inner circumferential surface of the external ring at a position toward the rear surface side of the semiconductor chip.

According to the present invention, there is provided a lead frame comprising a wiring film formed by laminating an insulation film on lead patterns, external connection terminals formed so as to protrude above the wiring film, a plurality of leads extending from the wiring film and forming connecting portions to electrode pads on a semiconductor chip at the tip ends of the extensions thereof, and an external ring provided outside the wiring film, having an opening portion capable of housing the semiconductor chip and formed with a plurality of through holes or blind holes.

Further, according to the present invention, the lead frame has a configuration wherein an outwardly expanded open portion is formed on an inner circumferential surface of the opening of the external ring at a position toward the rear surface side of the semiconductor chip.

A description will now be made with reference to the drawings on an embodiment of the semiconductor device and the lead frame according to the present invention.

Figure 4:
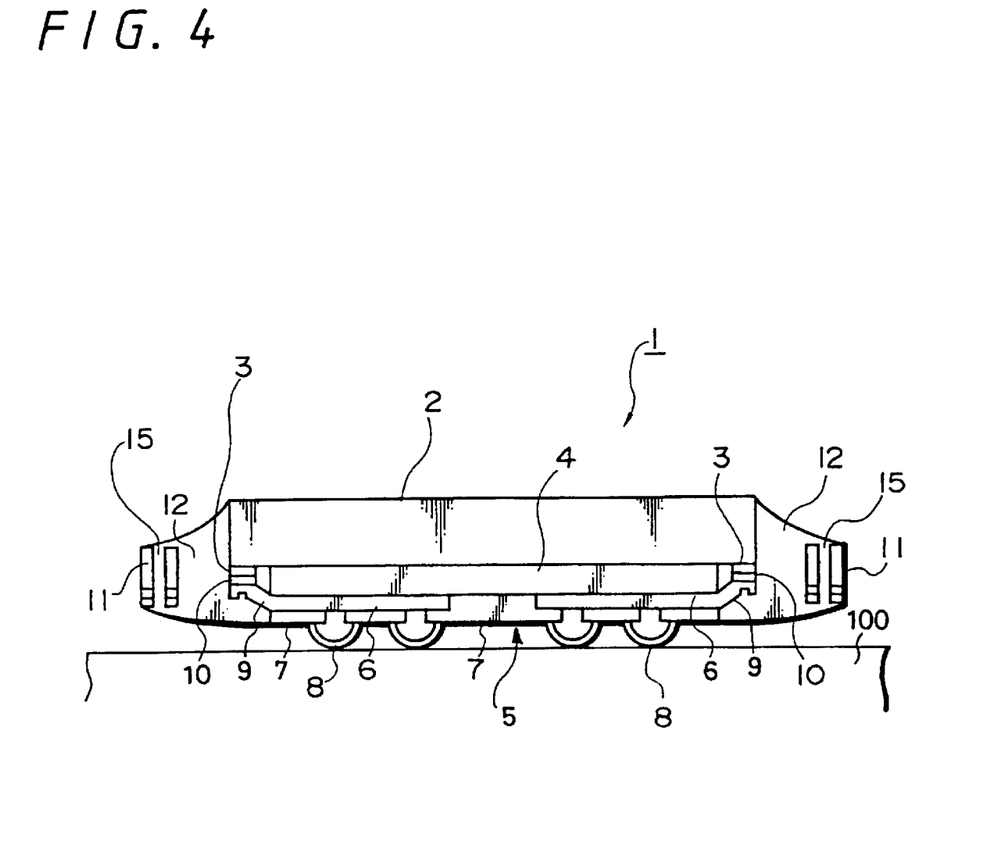
FIG. 4 is a configuration view (sectional view) showing an embodiment of a semiconductor device and a lead frame according to the present invention.

FIG. 4 is a sectional view showing a first embodiment of the semiconductor device (so-called semiconductor package in this embodiment) and the lead frame according to the present invention.

In a semiconductor package 1 of this embodiment, a plurality of electrode pads 3 are formed along the periphery of a surface of a semiconductor chip 2 (a lower surface of the semiconductor chip 2 in FIG. 4). At the center portion of the surface of the semiconductor chip 2 excluding the region where electrode the pads 3 are formed, there is disposed and formed a wiring film 5 with an adhesive layer 4 constituted by an adhesive sheet or the like interposed therebetween.

The wiring film 5 is configured by laminating an insulation film 7 on lead patterns 6. The adhesive layer 4 not only bonds the semiconductor chip 2 and the wiring film 5 but also serves as a buffering material for protecting an element formation region of the semiconductor chip 2 inside the region where the pads are formed.

External connection terminals 8 constituted by solder balls are formed so as to protrude above the wiring film 5 at ends of the lead patterns 6. A plurality of leads 9 are extended from the wiring film 5 in correspondence with the lead patterns 6, and the ends of the extensions thereof are connected to the electrode pads 3 of the semiconductor chip 2 through bumps 10 by means of, for example, ultrasonic single point bonding or the like.

Thus, the wiring film 5 is formed by the lead patterns 6, the insulation film 7 and the external connection terminals 8.

Meanwhile, an external ring 11 is provided outside the semiconductor chip 2 so as to surround the same. Sealing resin 12 is filled in the gap between the semiconductor chip 2 and the external ring 11.

Figure 5:
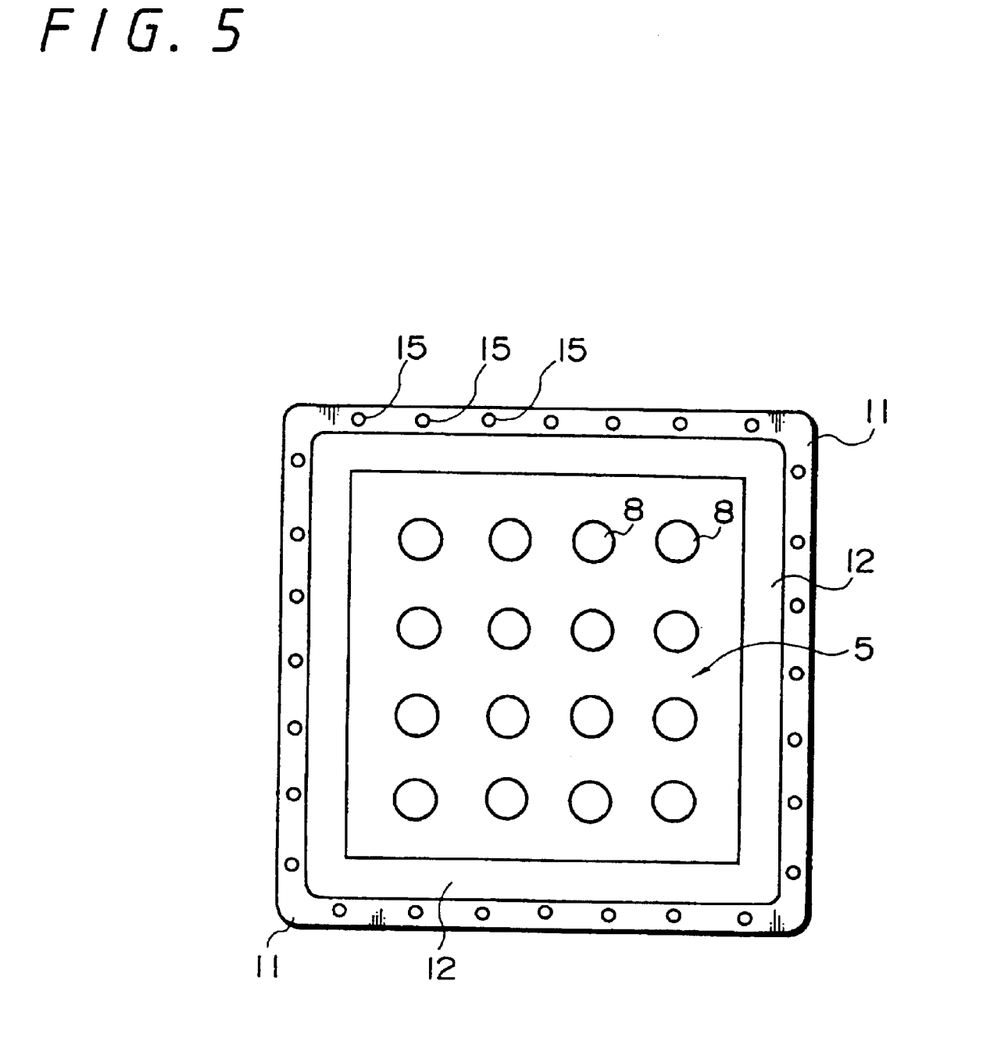
FIG. 5 is a plan view of the semiconductor device shown in FIG. 4.

As shown in the plan view of the semiconductor package 1 of FIG. 5, a plurality of through holes 15 are discretely formed on four sides of the external ring 11, and the external ring 11 is formed integrally with the wiring film 5.

The sealing resin 12 is of liquid form and is injected at a high speed in a sufficient amount from the underside using a dispenser or the like. The sealed resin is held inside the external ring 11 and in the through holes 15 of the external ring 11 and is set by a thermal setting means.

In the semiconductor package 1 of the embodiment, since the plurality of through holes 15 are formed on the four sides of the external ring 11 as described above, the sealing resin 12 is also filled in the through holes 15 to increase the area of contact between the sealing resin 12 and external ring 11.

Thus, the strength of the bonding between the sealing resin 12 and external ring 11 is improved to secure the sealing resin 12 to the external ring 11 more rigidly and, as a result, the semiconductor package 1 as a whole including the external ring 11 is stably sealed with the resin.

In FIG. 4, there is shown a printed wiring board 100 to which the external connection terminals 8 will be connected.

Next, a description will be made on a method of fabricating the above-mentioned semiconductor package 1 with reference to the drawings.

Figure 6A:
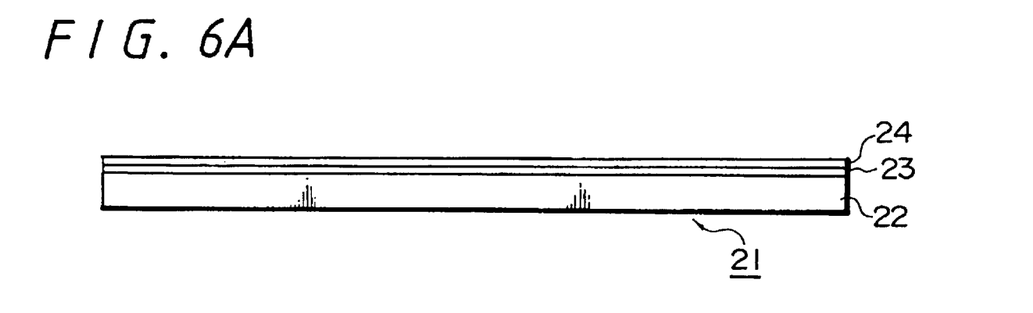
FIGS. 6A through 6L are process diagrams for fabricating the semiconductor device shown in FIG. 4.

First, as shown in FIG. 6A, a metal base 21 constituted by a laminated plate having a three-layer structure is prepared to fabricate a lead frame. The metal base 21 is obtained, for example, by forming an aluminum film 23 having a thickness of about 4.5 μm on a surface of a substrate 22 made of copper or a copper alloy having a thickness of about 150 μm (hereinafter referred to as a "copper substrate"), for example, by means of vapor deposition and by forming a nickel film 24 having a thickness of about 1 to 2 μm on the aluminum film 23.

Although the copper substrate 22 itself will not become the leads 9 and will be finally cut off except the portion of an external ring 11 to be described later, the copper substrate 22 is indispensable to form very fine lead patterns 6. The aluminum film 23 corresponds to an etching stopper film to prevent the front face side of the metal base 21 from being etched when the copper substrate 22 is etched at a subsequent process. The nickel film 24 corresponds to a substrate for electrolytic plating, i.e., a plating substrate film, for forming the lead patterns 6 on the surface of the metal base 21.

The metal base 21 may include a chromium film having a thickness of, for example, about 0.5 μm provided between the aluminum film 23 and nickel film 24 as a bonding film for enhancing bonding between them. A thin film of copper may be formed instead of the nickel film 24 as a plating substrate film. Further, a nickel film may be formed as an etching stopper film instead of the aluminum film.

Figure 6B:
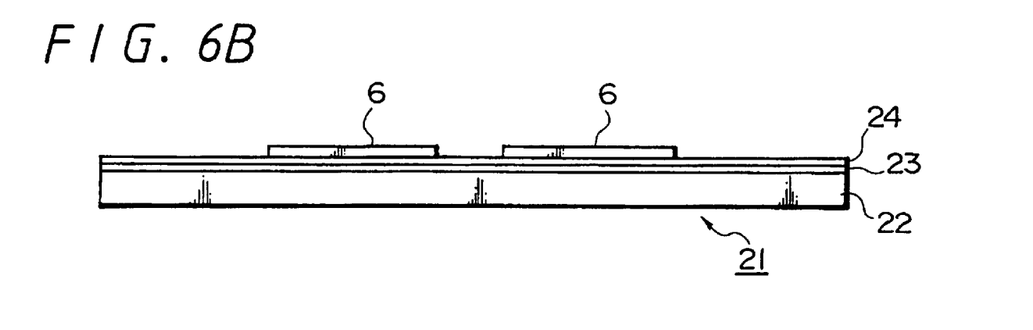

Next, as shown in FIG. 6B, a plurality of lead patterns 6 made of copper are formed on the surface of the metal base 21, i.e., the surface of the nickel film 24, using a selective plating method. The selective plating is carried out by selectively covering the surface of the metal base 21 with a resist pattern which is not shown and by performing electrolytic plating of copper using the resist pattern as a mask. This provides fine lead patterns 6 having good film quality.

Figure 6C:
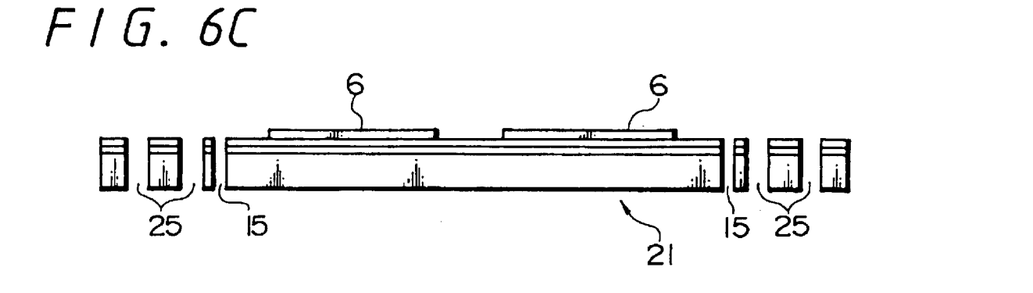

Next, as shown in FIG. 6C, selective etching is performed on both surfaces of the metal base 21 using, for example, a $H_2O_2/H_2SO_4$ type etchant to form slits 25 for defining an external configuration of the lead frame for each chip and to form through holes 15 to serve as through holes of the external ring later.

Figure 6D:
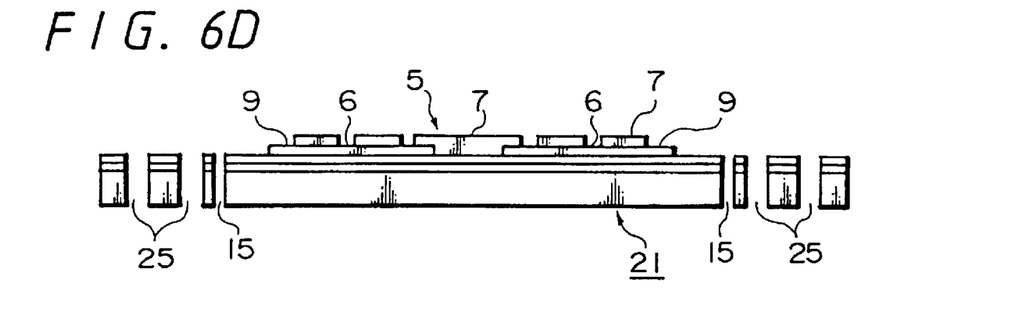

Next, as shown in FIG. 6D, an insulation film 7 constituted by, for example, a polyimide film is laminated on the lead patterns 6 formed by means of the selective etching to form a wiring film 5 comprised of the lead patterns 6 and the insulation film 7. At this point, a plurality of leads 9 extend from the wiring film 5 which are extensions of the lead patterns 6 formed previously.

Figure 6E:
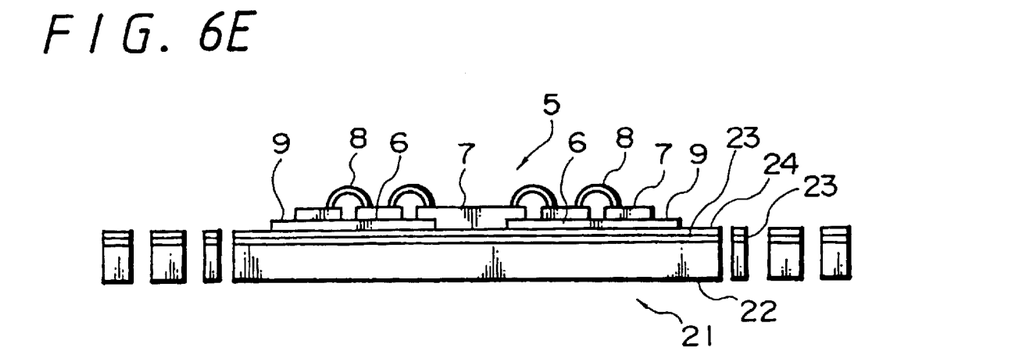

Subsequently, as shown in FIG. 6E, external connection terminals 8 constituted by, for example, solder balls are formed at ends of the lead patterns 6 covered by the insulation film 7 using the insulation film 7 as a mask. The external connection terminals 8 are obtained by forming nickel cores of 80 $\mu$m at the ends of the lead patterns 6 exposed on the insulation film 7 using, for example, electrolytic plating and coating the surface of the cores with a solder material made of a tin-lead alloy using an electrolytic plating method.

Figure 6F:
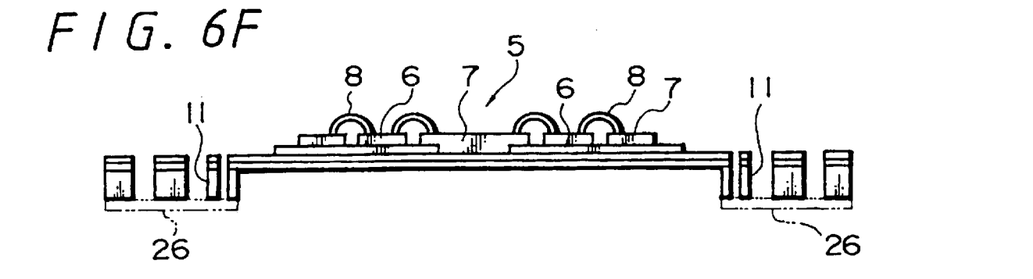

Then, as shown in FIG. 6F, the metal base 21 is covered by a mask 26 so as to leave the external ring 11, and the copper substrate 22 of the metal base 21 is removed by means of selective etching. During this etching, the aluminum film 23 acts as an etching stopper to remove only the copper substrate 22.

Figure 6G:
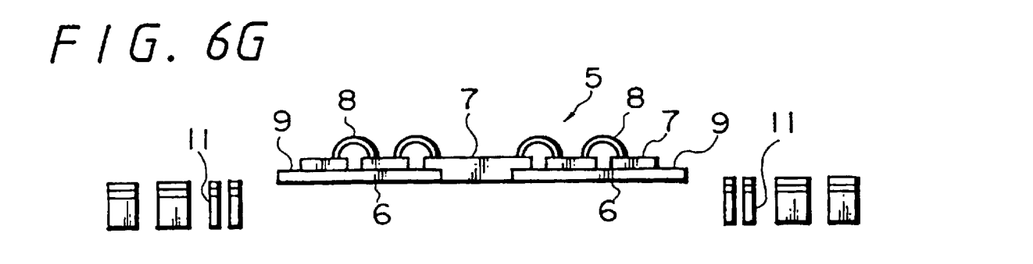

Next, as shown in FIG. 6G, the aluminum film 23 of the metal base 21 is removed by selective etching and the nickel film 24 is further removed by selective etching to separate each of the lead patterns 6 (including the leads 9) individually from one another.

Although it seems as if the wiring film 5 and the external ring 11 have been separated from each other in the state of FIG. 6G, they are actually connected to be integral with each other by suspended leads (not shown) which have been formed simultaneously with the lead patterns 6.

Figure 6H:
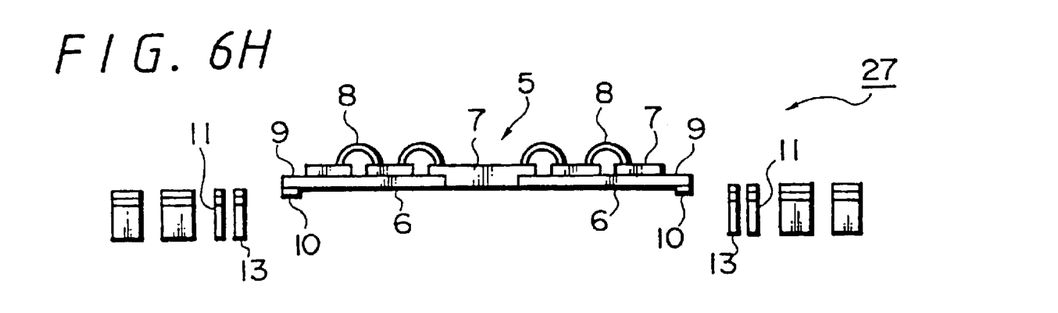

Next, as shown in FIG. 6H, a bump 10 made of aluminum is formed using, for example, sputtering or evaporation method on the tip end of each of the leads 9 extending from the wiring film 5.

This completes a lead frame 27 before being assembled to a semiconductor chip.

Subsequently, a semiconductor chip 2 is assembled to the lead frame 27 to fabricate a semiconductor package.

Figure 6I:
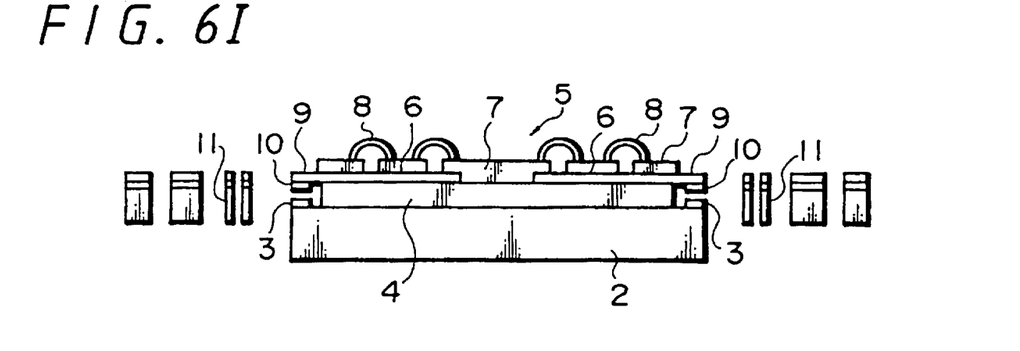

First, as shown in FIG. 6I, the semiconductor chip 2 is positioned on and secured to the rear surface side of the wiring film 5 with an adhesive layer 4 interposed therebetween. At this point, the tip end (bump 10) of each of the leads 9 extending from the wiring film 5 faces an electrode pad 3 on the semiconductor chip 2.

Figure 6J:
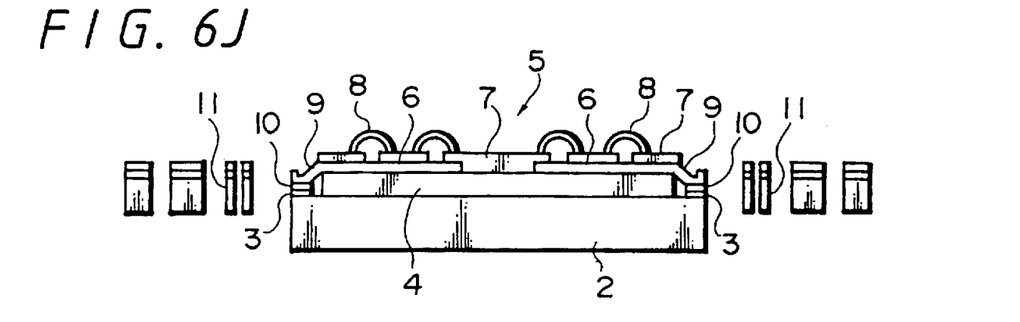

Next, as shown in FIG. 6J, the tip end of each lead 9 is connected to the electrode pad 3 on the semiconductor chip 2 through the bump 10 by means of single point bonding as described above.

Figure 6K:
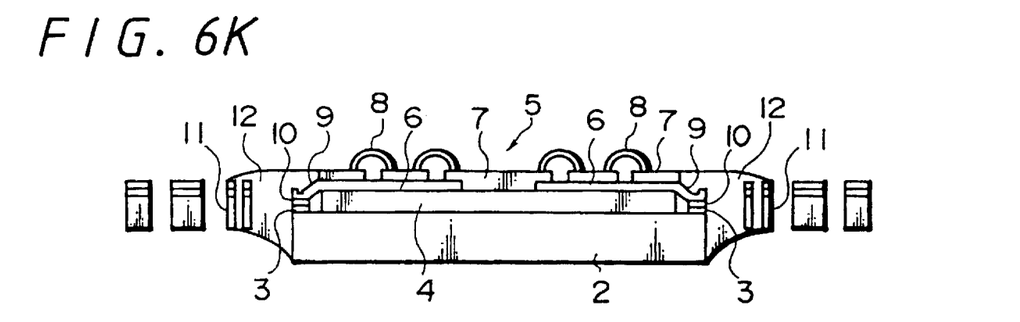

Then, as shown in FIG. 6K, sealing resin 12 such as epoxy resin, silicone resin or the like is injected between the semiconductor chip 2 and the external ring 11 from the rear surface side of the semiconductor chip 2 and is set to integrate the constituent parts.

Figure 6L:
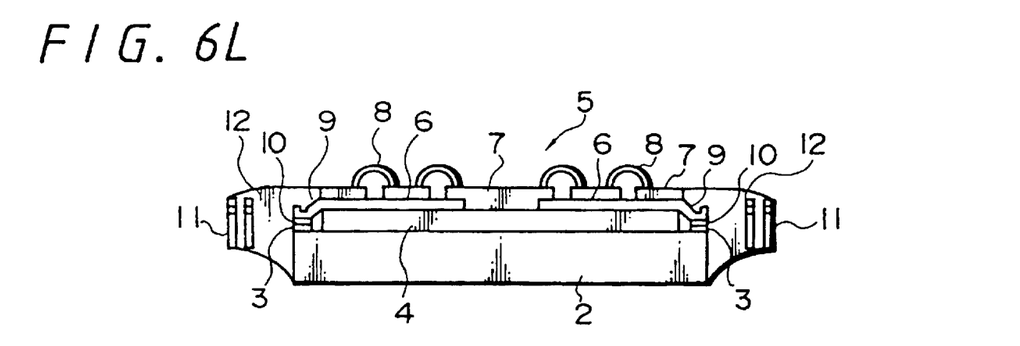

Finally, as shown in FIG. 6L, any unnecessary part is cut off from the periphery of the external ring 11 as a boundary.

Thus, the semiconductor package 1 as shown in FIG. 4 can be fabricated.

Figure 7:
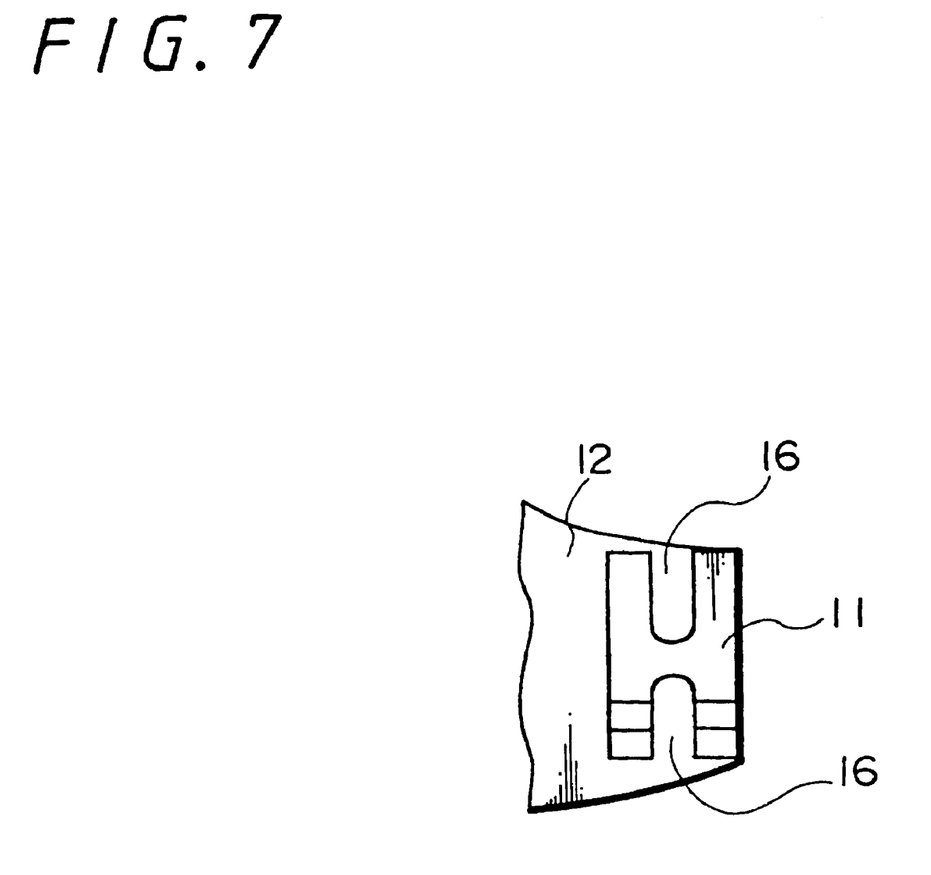
FIG. 7 is an enlarged view around an external ring of the semiconductor device in FIG. 4 where the holes of the external ring are blind holes.

Although through holes 15 are formed on the external ring 11 in the above-described embodiment, blind holes 16 may be formed from both sides of the external ring 11.

FIG. 7 shows an example of such an external ring 11.

Bonding strength can be also enhanced for such an external ring 11 by similarly injecting the sealing resin 12 to increase the area of contact between the sealing resin 12 and external ring 11.

Although not illustrated, the blind holes 16 may be blind holes which are open only on either front surface or rear surface of the semiconductor package 1.

When the holes formed on the external ring 11 are made as the blind holes 16, the process of forming the slits 25 and holes in the metal base 21 as previously shown in FIG. 3C is preferably divided into two stages, i.e., (1) a process of forming slits 25 that penetrate through the metal base 21 by performing selective etching from both sides thereof and (2) a process of forming through holes 16 by performing selective etching midway into the metal base 21 from both sides thereof.

The reason is that the separate processes allow easier control of the selective etching of the slits 25 and through holes 16 because they are to be formed to different depths.

A second embodiment of the semiconductor device and the lead frame according to the present invention will now be described with reference to the drawings.

Figure 8A:
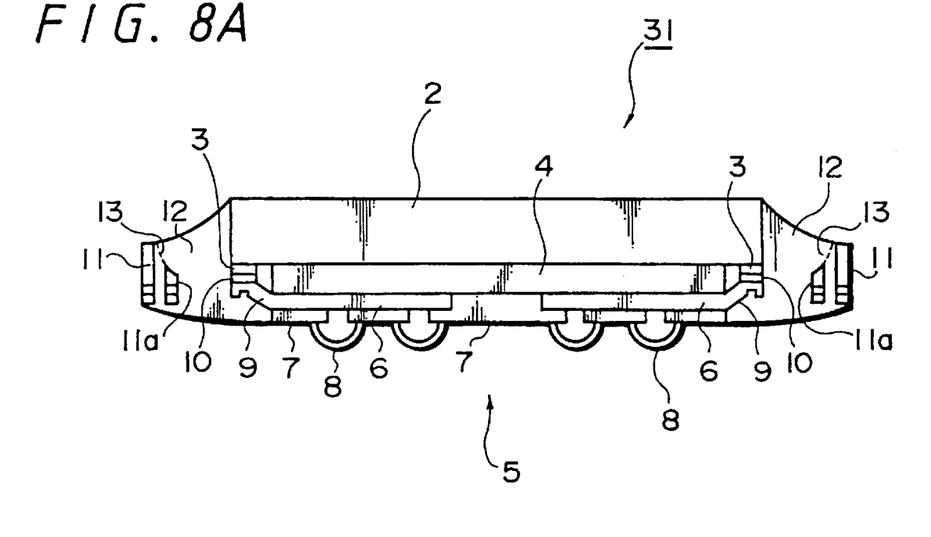
FIG. 8A is a schematic configuration view showing another embodiment of the semiconductor device and the lead frame according to the present invention.
Figure 8B:
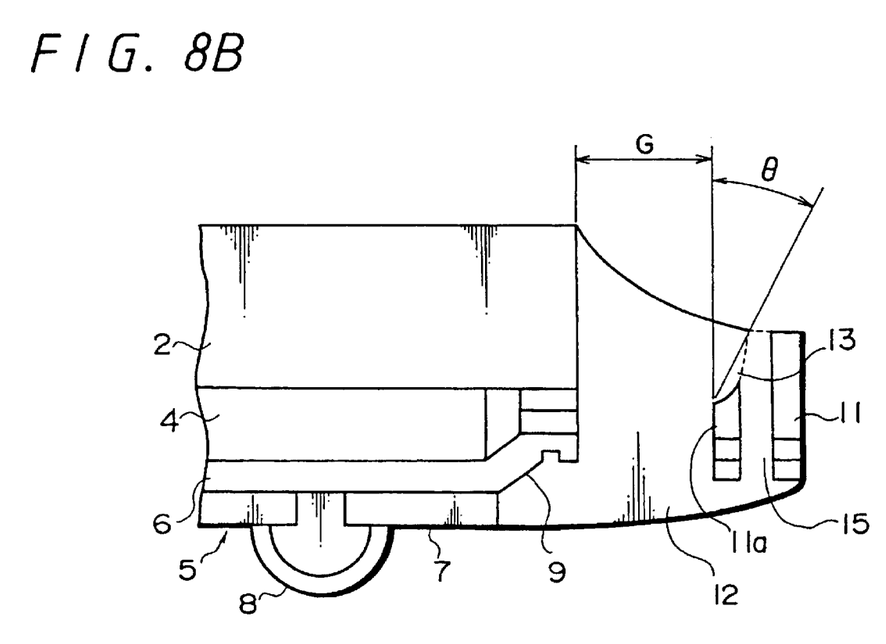
FIG. 8B is an enlarged view around the external ring.

FIGS. 8A and 8B are sectional views showing a second embodiment of the semiconductor device which is a semiconductor package in this case and a lead frame according to the present invention. FIG. 8A shows its overall configuration, and FIG. 8B is an enlarged view around its external ring.

Unlike the semiconductor package 1 shown in FIG. 4, a semiconductor package 31 of the second embodiment is formed with an outwardly expanded open portion 13 at a position on an inner circumferential surface 11a of an external ring 11 toward a rear surface of a semiconductor chip 2 (upper side in FIGS. 8A and 8B). For example, the expanded open portion 13 is formed at an angle $\theta=30°$ to $45°$ relative to the inner circumferential surface 11a of the external ring 11.

As a result, as shown in FIG. 8B, there is an open portion expanded greater than a gap G between the semiconductor chip 2 and the external ring 11 on the rear surface side of the semiconductor chip 2. Thus, the resin injection port for injecting the sealing resin 12 is expanded by a corresponding amount.

This facilitates the injection of resin from the rear surface side of the semiconductor chip 2 and makes it possible to reduce the size (outer diameter) of the external ring 11.

The other configuration is similar to that of the semiconductor package 1 of the first embodiment shown in FIG. 4 and illustrated with like reference numbers. The description will be omitted for such to avoid duplication.

During the fabrication of the semiconductor package 31, the expanded open portion 13 of the external ring 11 is formed by employing, for example, a $H_2O_2$ (peroxide)/ $H_2SO_4$ (sulfuric acid) type etchant at the process of selectively etching the copper substrate 22 shown in FIG. 6F, setting the concentration of $H_2O_2$ at 10% or less and spraying the etchant on the copper substrate 22.

Figure 9:
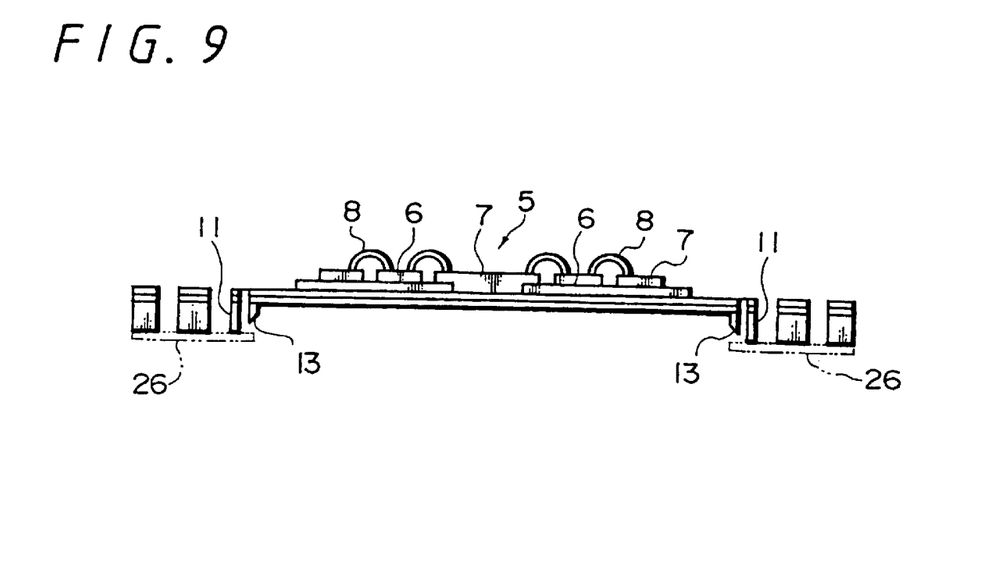
FIG. 9 is a process diagram for fabricating the semiconductor device in FIG. 8.

As a result, as shown in FIG. 9, the inner circumferential surface of the external ring 11 is etched in a tapered configuration (side etching), and the tapered configuration becomes significant in inverse proportion to the $H_2O_2$ concentration. Therefore, it is possible to form the outwardly expanded open portion 13 in a desired size on the inner circumferential surface of the external ring 11.

Other process are the same as the fabrication process of the first embodiment shown in FIGS. 6A through 6L.

By the way, the tapered configuration of the expanded open portion 13 can be adjusted by changing the temperature conditions, $H_2SO_4$ concentration or spraying pressure.

The semiconductor device and the lead frame of the present invention are not limited to the above-described embodiments, and various other configuration may be employed without departing from the principle of the present invention.

According to the semiconductor device of the present invention, since sealing resin is filled in a plurality of through holes or blind holes formed in the external ring to increase the area of contact between the sealing resin and the external ring, the bonding strength of the sealing resin is improved and the sealing resin is more rigidly secured to the external ring.

Thus, the resin sealing of the lead frame including the external ring and the semiconductor device as a whole is stabilized.

Further, the lead frame according to the present invention as described above includes the external ring formed with the plurality of through holes or blind holes. Therefore, the holes in the external ring increase the surface area of the external ring, thereby increasing the area of contact between resin and the external ring when the resin is injected later for sealing.

This improves the bonding strength of resin sealing.

In addition, when an outwardly expanded open portion is formed on the inner circumferential surface of the external ring and positioned on the rear surface side of the semiconductor chip, a wide resin injection port can be obtained at the clearance portion between the semiconductor chip and the external ring on the rear surface side of the chip. This allows the injection of resin from the rear surface side of the chip to be carried out easily even if the size of the external ring is reduced.

Figure 10:
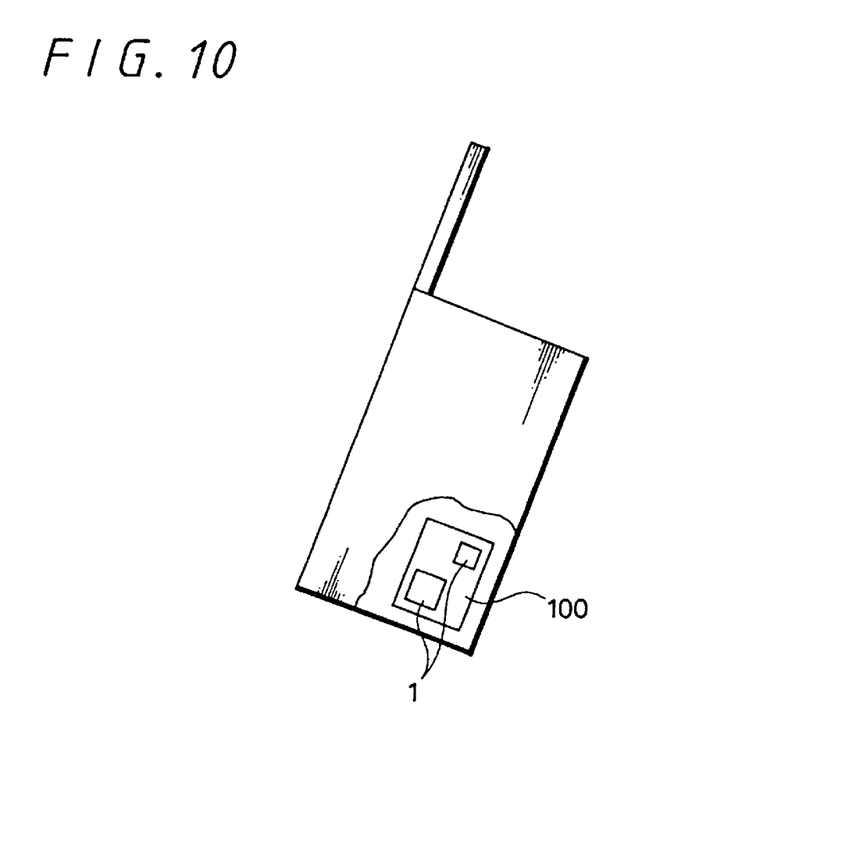
FIG. 10 is a diagram showing an electronic equipment having a printed circuit board mounted with a semiconductor device according to the present invention.

By connecting the external connection terminals 8 of a semiconductor device according to the present invention to the printed wiring board 100 as shown in FIG. 4 and installing the printed wiring board 100 carrying the semiconductor device according to the invention in, for example, an electronic apparatus such as a portable telephone as shown in FIG. 10, the electronic apparatus can be loaded with a high quality compact semiconductor device with stable resin sealing, which contributes to reduction of the size of the electronic apparatus itself.

Having described preferred embodiments of the present invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device, comprising:
   a semiconductor chip having a plurality of electrode pads formed at a periphery of a front surface thereof;
   a wiring film formed on the front surface side of said semiconductor chip by laminating an insulation film on a lead pattern;
   an outer connection terminal formed so as to protrude above said wiring film;
   a plurality of leads extending from said wiring film and connected to the electrode pads on said semiconductor chip at extended tips end thereof;
   an external ring provided so as to surround said semiconductor chip and formed with a plurality of through holes positioned entirely outside of a perimeter edge of the semiconductor chip, the external ring comprising an outwardly expanded portion formed on an inner circumferential surface of the external ring and positioned on a rear surface of the semiconductor chip; and
   a sealing resin filled between said semiconductor chip and said external ring, the sealing resin further being filled in the through holes to increase the contact area between the sealing resin and the external ring which strengthens the bond between the sealing resin and the external ring.

2. A lead frame, comprising:
   a wiring film formed by laminating an insulation film on a lead pattern;
   an external connection terminal formed so as to protrude above said wiring film;
   a plurality of leads extending from said wiring film and forming connecting portions to electrode pads on a semiconductor chip at extended tip ends thereof;
   an external ring provided outside said wiring film, having an opening portion capable of housing said semiconductor chip and formed with a plurality of through holes positioned entirely outside of a perimeter edge of the semiconductor chip when the opening portion houses the semiconductor chip wherein an outwardly expanded open portion is formed an inner circumferential surface of the external ring and positioned on a rear surface side of the semiconductor chip such that the expanded open portion is formed at an angle of 30° to 45° relative to the inner circumferential surface of the external ring.

3. An electronic apparatus including a printed wiring board loaded with a semiconductor chip, said semiconductor device, comprising:
   a semiconductor chip having a plurality of electrode pads formed at a periphery of a front surface thereof;
   a wiring film formed on a front surface side of said semiconductor chip by laminating an insulation film on lead patterns;
   an outer connection terminal formed so as to protrude above said wiring film;
   a plurality of leads extending from said wiring film and connected to the electrode pads on said semiconductor chip at extended tip ends thereof;
   an external ring provided so as to surround said semiconductor chip and, formed with a plurality of through holes positioned entirely outside of a perimeter edge of the semiconductor chip, the external ring comprising an outwardly expanded portion formed on an inner circumferential surface of the external ring and positioned on a rear surface of the semiconductor chip; and a sealing resin filled between said semiconductor chip and said external ring, the sealing resin further being filled in the through holes to increase the contact area between the sealing resin and the external ring which strengthens the bond between the sealing resin and the external ring, wherein said external connection terminal and an electrode on said printed wiring board are connected.

4. A method of manufacturing a semiconductor device formed by loading a semiconductor chip on a wiring film comprising the steps of:

forming leads made of metal on a metal base constituted by a plurality of metal layers including an etching stopper layer;

partially etching an outer peripheral portion of said metal base where said leads are formed to form an external ring and through holes or blind holes of said external ring;

forming an insulation film having a plurality of openings on said leads;

forming external connection terminals on the openings of said insulation film to electrically connect the same to said leads;

etching said metal base from the side opposite to the surface where said external terminals are formed so as to leave said external ring utilizing said etching stopper layer;

removing an unnecessary part of said metal base by selective etching to electrically separate said leads independently, thereby forming said wiring film; and connecting extended tip ends of said leads extending from said wiring film to electrode pads on said semiconductor chip.

5. A method of manufacturing a semiconductor device according to claim 4, further comprising the step of etching an inner circumferential surface of said external ring in a tapered configuration to form an outwardly expanded open portion positioned on a rear surface side of said semiconductor chip.

6. A method of mounting a semiconductor device on a wiring board, wherein the method of manufacturing a semiconductor device according to claim 4 comprises the step of connecting said external terminals to electrodes on said wiring board.

7. A semiconductor device according to claim 1, wherein the external ring has an open top and an open bottom and is entirely spaced away from the semiconductor chip.

8. A lead frame device according to claim 2, wherein the external ring has an open top and an open bottom and is entirely spaced away from the semiconductor chip when the opening portion houses the semiconductor chip.

9. An electronic apparatus according to claim 3, wherein the external ring has an open top and an open bottom and is entirely spaced away from the semiconductor chip.

* * * * *